(12) United States Patent
Kawashima

(10) Patent No.: US 6,707,234 B1
(45) Date of Patent: Mar. 16, 2004

(54) QUARTZ CRYSTAL UNIT, ITS MANUFACTURING METHOD AND QUARTZ CRYSTAL OSCILLATOR

(75) Inventor: Hirofumi Kawashima, Tokyo (JP)

(73) Assignee: Piedek Technical Laboratory, Tokyo (JP)

( * ) Notice: Subject to any disclaimer, the term of this patent is extended or adjusted under 35 U.S.C. 154(b) by 0 days.

(21) Appl. No.: 10/306,697

(22) Filed: Nov. 27, 2002

(30) Foreign Application Priority Data

Sep. 19, 2002 (JP) ........................................ 2002-311895
Nov. 11, 2002 (JP) ........................................ 2002-363088

(51) Int. Cl.$^7$ .............................................. H01L 41/08

(52) U.S. Cl. ...................................................... 310/367

(58) Field of Search ................................... 310/367, 368, 310/320, 348, 351, 344, 361; H01L 41/08

(56) References Cited

U.S. PATENT DOCUMENTS

| | | | | |
|---|---|---|---|---|
| 4,313,071 A | * | 1/1982 | Hermann et al. ........... | 310/361 |
| 4,350,918 A | * | 9/1982 | Sato ........................... | 310/367 |
| 4,355,257 A | * | 10/1982 | Kawashima et al. ........ | 310/361 |
| 4,900,971 A | * | 2/1990 | Kawashima ................. | 310/361 |

OTHER PUBLICATIONS

Proceedings of The 1992 IEEE Frequency Control Symposium, "New Cuts for Width–Extensional Mode Quartz Crystal Resonators", H. Kawashima, May 27–29, 1992, pp. 525–531.

Proceedings of The 1993 IEEE International Frequency Contol Symposium, "Forced Vibrations of KT–Cut Width–Extensional Mode Quartz Crystal Resonators", H. Kawashima, Jun. 2–4, 1993, pp. 527–534.

* cited by examiner

Primary Examiner—Thomas M. Dougherty
Assistant Examiner—Karen Beth Addison
(74) Attorney, Agent, or Firm—Adams & Wilks

(57) ABSTRACT

A quartz crystal unit, its manufacturing method and a quartz crystal oscillator are illustrated. In particular, the quartz crystal unit and the quartz crystal oscillator having a width-extensional mode quartz crystal resonator comprising a vibrational portion, connecting portions and supporting portions are illustrated with a cutting angle and electrode construction, which provides a high frequency and a high electro-mechanical transformation efficiency, even when the resonator is miniaturized. As a result of which the miniature quartz crystal unit and the quartz crystal oscillator may be provided with a zero temperature coefficient, a small series resistance $R_1$ and a high quality factor Q. That is, these are accomplished by the cutting angle, the electrode construction and a large piezoelectric constant of the width-extensional mode quartz crystal resonator.

20 Claims, 10 Drawing Sheets

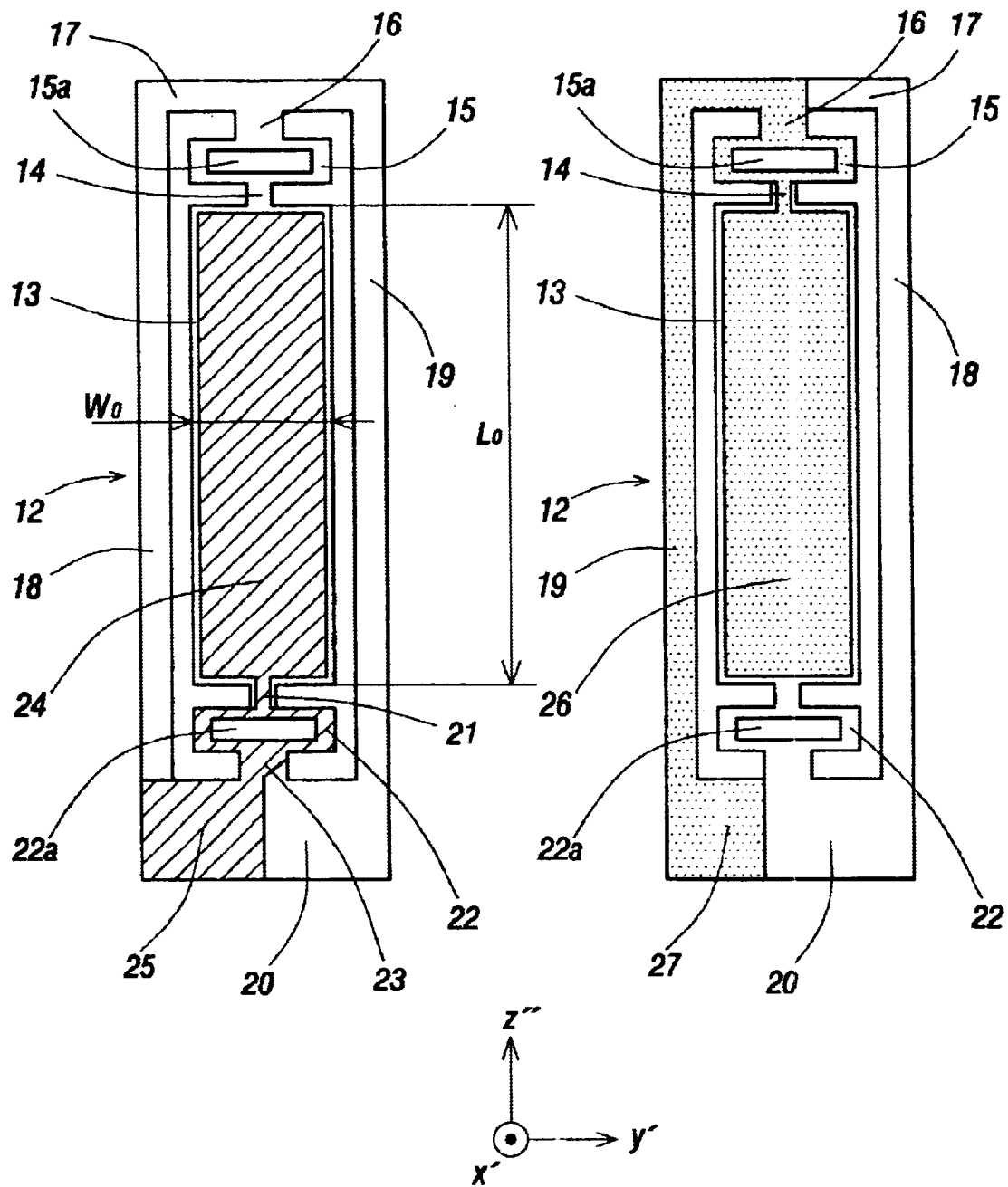

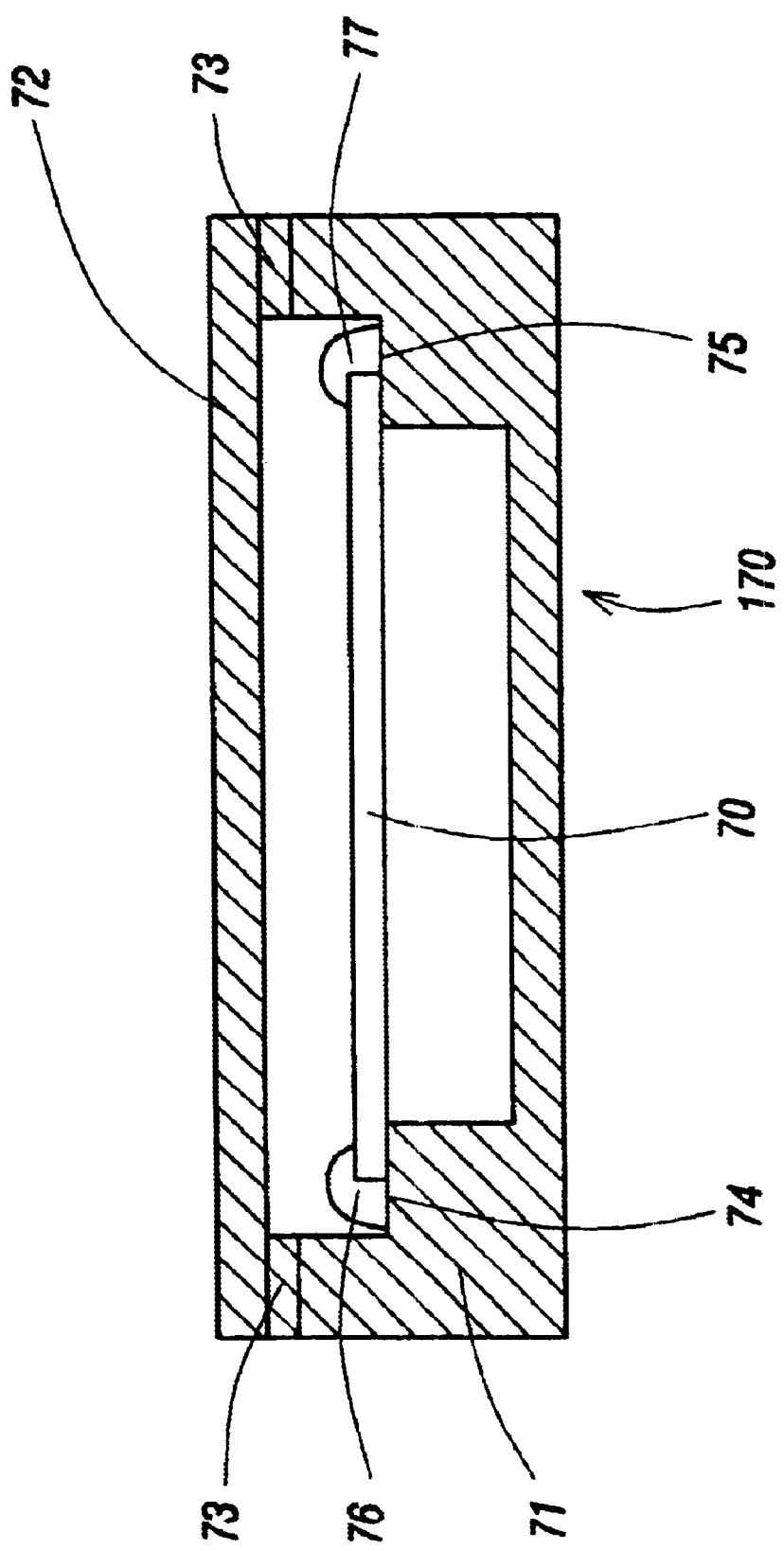

QUARTZ CRYSTAL UNIT, ITS MANUFACTURING METHOD AND QUARTZ CRYSTAL OSCILLATOR

FIELD OF THE INVENTION

The present invention relates to a quartz crystal unit, its manufacturing method and a quartz crystal oscillator.

In particular, the present invention relates to the quartz crystal unit and the quartz crystal oscillator comprising a width-extensional mode quartz crystal resonator with a new cut angle and new electrode construction which is available for wearable equipment, communication equipment, measurement apparatus and consumer products requiring miniaturization, high accuracy, shock-proof and low prices for the quartz crystal resonator.

BACKGROUND OF THE INVENTION

A NS-GT cut coupling quartz crystal resonator which vibrates in the coupled width-extensional mode and length-extensional mode is well known and used as a time standard of consumer products and communication equipment. FIG. 9a and FIG. 9b show a top view and a side view of the conventional NS-GT cut coupling quartz crystal resonator. In FIGS. 9a, 9b, The resonator 200 comprises vibrational portion 201, connecting portions 203, 206 and supporting portions 204, 207. The supporting portions 204 and 207 include respective mounting portions 205 and 208.

In addition, as shown in FIG. 9a and FIG. 9b, electrodes 202 and 211 are disposed on the upper and lower faces of the vibrational portion 201, the electrode 202 extends to the mounting portion 205 through the connecting portion 203, while the electrode 211 extends to the mounting portion 208 through the connecting portion 206. The electrodes 202 and 211 have opposite electrical polarities, and two electrode terminals are constructed.

Also, as shown in FIG. 10, the resonator 200 is mounted on a pedestal 313 by conductive adhesives at the mounting portions 205 and 208. Furthermore, the pedestal 313 is connected to two lead wires 314, 315 which pass through a case 311, and the pedestal 313 with the resonator 200 is housed in a quartz crystal unit of tubular type 300 comprising the case 311 and a cap 312. Namely, the electrodes 202 and 211 are connected to the lead wires 314 and 315, respectively.

Now, when an alternating current(AC) voltage is applied between both lead wires 314 and 315, an electric field $E_t$ occurs alternately in the thickness T direction, as shown by arrow signs of the solid and broken lines in FIG. 9b. As a result, the coupled width-extensional mode and the length-extensional mode whose frequencies are inversely proportional to width W and length L of the vibrational portion, respectively, can be excited at the same time, and the NS-GT cut coupling resonator coupled in inverse phase is provided. The above-mentioned resonator is formed integrally by a chemical etching process.

In addition, the lager the area of vibrational portion for the NS-GT cut resonator becomes (low frequency), the smaller series resistance $R_1$ becomes and the larger quality factor Q becomes. Also, the NS-GT cut resonator with excellent frequency temperature behavior is determined by a dimensional ratio W/L, and which has a value of 0.95 approximately. In order to get a frequency higher than 4 MHz, it is necessary to decrease the area of the vibrational portion for the resonator.

Recently, according to the miniaturization and weight lightness of consumer products and communication equipment with a frequency higher than 4 MHz, a miniature quartz crystal unit and a miniature quartz crystal oscillator comprising a NS-GT cut resonator with the higher frequency is also required with a small series resistance $R_1$ and high quality factor Q.

It is, however, impossible to provide a miniature quartz crystal unit and a miniature quartz crystal oscillator having a NS-GT cut resonator with a frequency higher than about 4 MHz with a small series resistance $R_1$ and a high quality factor Q because the area of vibrational portion for the resonator becomes very small to get the higher frequency, and more an electro-mechanical transformation efficiency becomes very small, so that a series resistance $R_1$ becomes large and a quality factor Q also becomes small.

It is, therefore, desirable to provide a quartz crystal unit and a quartz crystal oscillator comprising a novel and miniature quartz crystal resonator with a frequency higher than about 4 MHz with a small series resistance $R_1$, a high quality factor Q and a zero temperature coefficient.

SUMMARY OF THE INVENTION

The present invention relates to a quartz crystal unit, its manufacturing method and a quartz crystal oscillator, In addition, the quartz crystal unit and the quartz crystal oscillator comprise a width-extensional mode quartz crystal resonator capable of vibrating in a single mode with a high electro-mechanical transformation efficiency and a zero temperature coefficient.

In particular, the present invention relates to the quartz crystal unit and the quartz crystal oscillator comprising the width-extensional mode quartz crystal resonator with a new cutting angle and new electrode construction.

It is an object of the present invention to provide a miniature quartz crystal unit comprising a width-extensional mode quartz crystal resonator with a high electro-mechanical transformation efficiency.

It is an another object of the present invention to provide a miniature quartz crystal unit comprising a width-extensional mode quartz crystal resonator with a frequency higher than about 4 MHz with a small series resistance $R_1$ and a high quality factor Q.

It is a further object of the present invention to provide a miniature quartz crystal unit comprising a width-extensional mode quartz crystal resonator with a zero temperature coefficient.

It is a still firer object of the present invention to provide a method of manufacturing a quartz crystal unit comprising a width-extensional mode quartz crystal resonator.

It is an another object of the present invention to provide a miniature quartz crystal oscillator comprising a width-extensional mode quartz crystal resonator with a high electro-mechanical transformation efficiency, a small series resistance $R_1$, a high quality factor Q and a zero temperature coefficient.

In order to accomplish a miniature quartz crystal unit and a miniature quartz crystal oscillator comprising a width-extensional mode quartz crystal resonator with a frequency higher than about 4 MHz and a high electro-mechanical transformation efficiency by which a small series resistance $R_1$ and a high quality factor Q are provided, it is needed to provide a novel width-extensional mode quartz crystal resonator which is formed from a quartz crystal plate with a new cutting angle, new electrode construction and a large piezo-electric constant.

In accordance with the present invention, the quartz crystal unit and the quartz crystal oscillator are accomplished by a width-extensional mode quartz crystal resonator with a new cutting angle and having new electrode construction and a large piezoelectric constant.

In more detail, such a resonator is formed in accordance with the present invention, from a quartz crystal plate of a new cutting angle using a particle method.

Moreover, such a resonator is provided in accordance with the present invention, by new electrode construction and a large piezoelectric constant.

In addition, in accordance with the present invention, a width-extensional mode quartz crystal resonator with a zero temperature coefficient is accomplished by a cutting angle. As a result of which a quartz crystal unit and a quartz crystal oscillator of the present invention comprising the width-extensional mode quartz crystal resonator have good frequency temperature behavior over a wide temperature range, respectively.

The present invention will be more fully understood by referring to the following detailed specification and claims taken in connection with the appended drawings.

BRIEF DESCRIPTION OF THE DRAWINGS

FIG. 3a and FIG. 3b are a top view and a bottom view for a width-extensional mode quartz crystal resonator which constructs a quartz crystal unit and a quartz crystal oscillator of the present invention;

FIG. 6 is a sectional view of a quartz crystal unit embodying the present invention;

DETAILED DESCRIPTION

Figure 1:
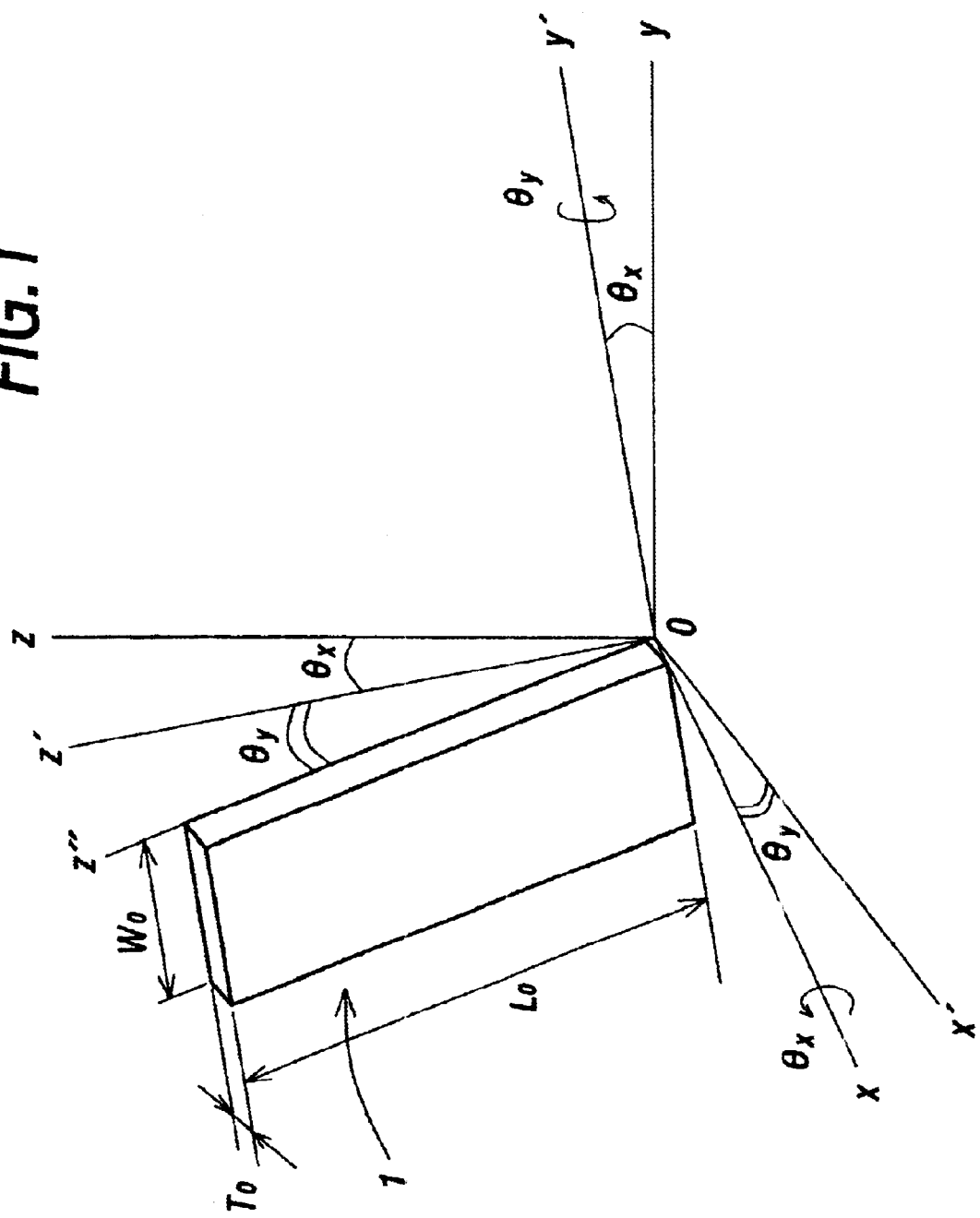
FIG. 1 is a general view of quartz crystal plate from which a width-extensional mode quartz crystal resonator of the present invention is formed, particularly, illustrating a relationship of a cutting angle of quartz crystal plate and its coordinate system.

Referring now to the drawings, the embodiments of the present invention will be described in more detail.

FIG. 1 is a general view of quartz crystal plate from which a width-extensional mode quartz crystal resonator of the present invention is formed, and particularly, a relationship of cutting angles $\theta_x$ and $\theta_y$ of quartz crystal plate 1 and its coordinate system is illustrated. The coordinate system has original point o, electrical axis x, mechanical axis y and optical axis z, and o-xyz is constructed.

First, a quartz crystal plate perpendicular to x axis, so called, X plate quartz crystal is taken. Width $W_0$, length $L_0$ and thickness $T_0$ which are each dimension of the X plate quartz crystal correspond to the respective directions of y, z and x axes.

Next, this X plate quartz crystal is, fit, rotated with an angle $\theta_x$ of $-25°$ to $+25°$ about the x axis, and second, rotated with an angle $\theta_y$ of $-30°$ to $+30°$ about y' axis which is the new axis of the y axis. In this case, the new axis of the x axis changes to x' axis and the new axis of the z axis changes to z" axis because the z axis is rotated twice about two axes, the width-extensional mode quartz crystal resonator of the present invention is formed from the quartz crystal plate with the rotation angles.

In this embodiment, though the X plate quartz crystal is, first, rotated with the angle $\theta_x$ about the x axis, and second, rotated with the angle $\theta_y$ about the y' axis, embodiment of the present invention may change the rotation order of the angles $\theta_x$ and $\theta_y$. Namely, the X plate is, first, rotated with $\theta_y$ about the y axis, and second, rotated with $\theta_x$ about the x' axis.

In other words, according to an expression of IEEE notation, a cutting angle of the width-extensional mode quartz crystal resonator of the present invention can be expressed by either of XZtw($-25°$–$+25°$)/($-30°$–$+30°$) and XZwt($-30°$–$+30°$)/($-25°$–$+25°$). Namely, a cutting angle of the resonator is expressed by either of XZtw($\theta_x$)/($\theta_y$) and XZwt($\theta_y$/$\theta_x$) and the $\theta_x$ and $\theta_y$ are within a range of $-25°$ to $+25°$ and $-30°$ to $+30°$, respectively.

Figures 2A, 2B:
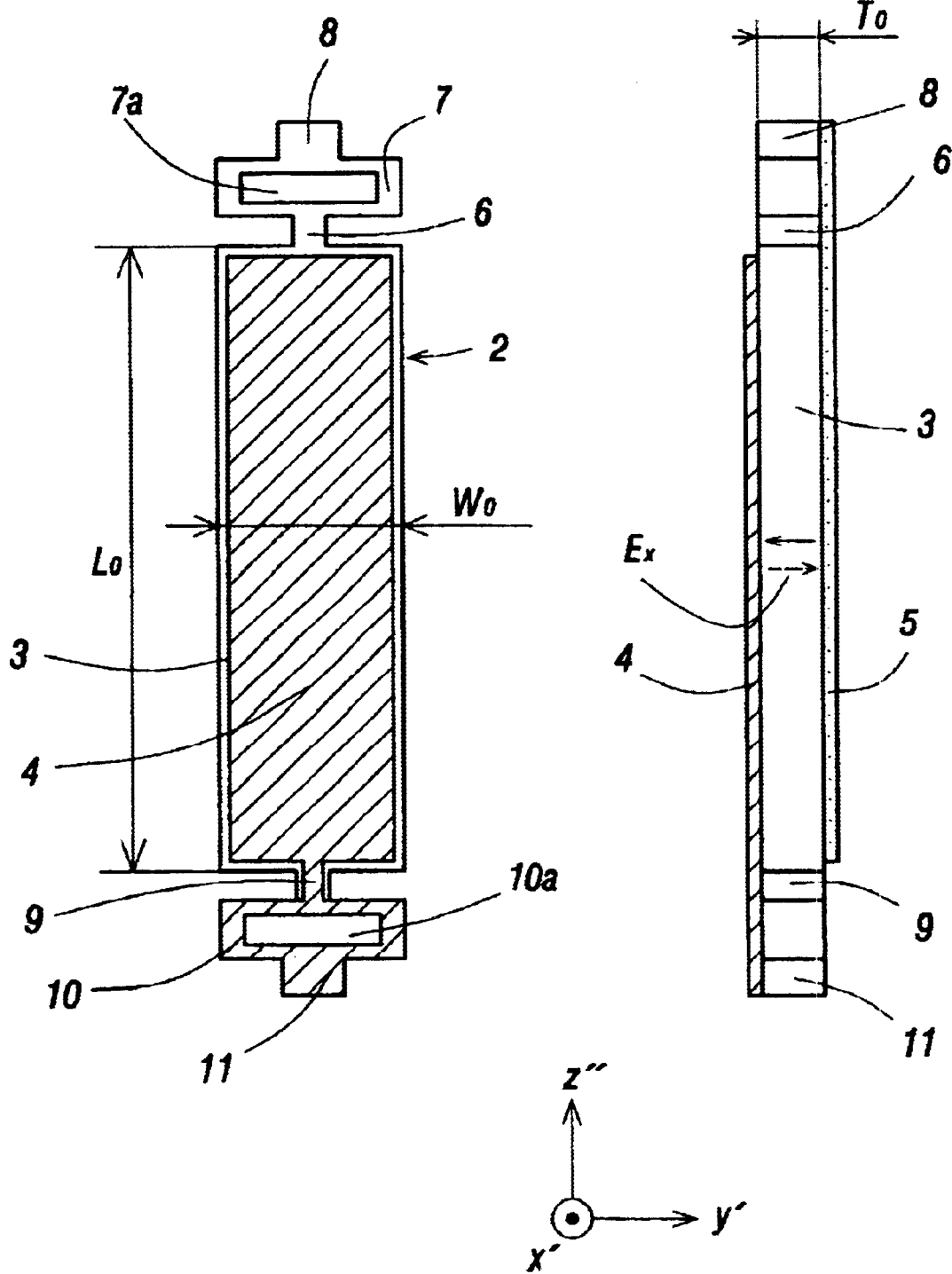
FIG. 2a and FIG. 2b are a top view and a side view for a width-extensional mode quartz crystal resonator which constructs a quartz crystal unit and a quartz crystal oscillator of the present invention.

FIG. 2a and FIG. 2b are a top view and a side view for a width-extensional mode quartz crystal resonator which constructs a quartz crystal unit and a quartz crystal oscillator of the first embodiment of the present invention. The resonator 2 comprises vibrational portion 3, connecting portions 6, 9 and supporting portions 7, 10 including respective mounting portions 8, 11. In addition, the supporting portions 7 and 10 have respective holes 7a and 10a. Also, electrodes 4 and 5 are disposed opposite each other on upper and lower faces of the vibrational portion 3, the electrodes have opposite electrical polarities. Namely, a pair of electrodes is disposed on the vibrational portion. In this case, a fundamental mode vibration can be excited easily.

In addition, the electrode 4 extends to the mounting portion 11 through the one connecting portion 9 and the electrode 5 extends to the mounting portion 8 through the other connecting portion 6. In this embodiment, the electrodes 4 and 5 disposed on the vibrational portion 3 extend to the mounting portions of the different direction each other. However, a resonator with the same characteristics as said resonator can be obtained, even if the electrodes 4 and 5 extend to the mounting portions of the same direction each other. The resonator in this embodiment is mounted on fixing portions of a case or a lid at the mounting portions 8 and 11 by conductive adhesives or solder.

Moreover, the vibrational portion 3 has a dimension of width $W_0$, length $L_0$ and thickness $Z_0$, also, width $W_0$, length $L_0$ and thickness $T_0$ correspond to y', z" and x' axes, respectively. That is, the electrodes 4 and 5 are disposed on the upper and lower faces of the vibrational portion 3 perpendicular to the x' axis.

In addition, the vibrational portion 3 has a dimension of length $L_0$ greater than width $W_0$ and thickness $T_0$ smaller than the width $W_0$. Namely, a coupling between width-extensional mode and length-extensional mode gets as small as it can be ignored, as a result of which, the quartz crystal resonator can vibrate in a single width-extensional mode, and also, a width-to-length ratio ($W_0/L_0$) has a value smaller than 0.7 to provide the resonator with a small series resistance $R_1$ by increasing electrode area of the vibrational portion. In addition, a thickness-to-width ratio ($T_0/W_0$) has a value smaller than 0.85 to provide the resonator with a small $R_1$ by increasing the intensity of an electric field $E_x$. These actual dimensions are, therefore, determined by the requirement characteristics for the width-extensional mode quartz crystal resonator.

In more detail, resonance frequency of the width-extensional mode quartz crystal resonator is inversely proportional to width $W_0$, and it is almost independent on such an other dimension as length $L_0$, thickness $T_0$, connecting portions and supporting potions. Also, in order to obtain a width-extensional mode quartz crystal resonator with a frequency of 4 MHz, the width $W_0$ is about 0.7 mm. Thus, the miniature width-extensional mode quartz crystal resonator is provided with a frequency higher than 4 MHz because resonance frequency of the resonator is inversely proportional to the width $W_0$. Also, the resonator capable of vibrating in a single width-extensional mode can be obtained from the relation of said dimensions.

Next, a value of a piezoelectric constant $e_{12}$ is described, which is of great importance and necessary to excite a width-extensional mode quartz crystal resonator of the present invention. The larger a value of this piezoelectric constant $e_{12}$ becomes, the higher an electro-mechanical transformation efficiency becomes. For example, the piezoelectric constant $e_{12}$ is within a range of 0.095 C/m² to 0.18 C/m² approximately in an absolute value, when a cutting angle of the resonator is expressed by XZtw($\theta_x$)($\theta_y$) and the angle $\theta_x$ has a value of −25° to +25° and the angle $\theta_y$ has a value of −30° to +30°. Also, the piezoelectric constant $e_{12}$ can be calculated from the piezoelectric constants $e_{11}$=0.171 C/m² and $e_{14}$=0.0406 C/m² of quartz crystal. It is easily understood that these are enough large values to obtain a width-extensional mode quartz crystal resonator with a small series resistance and a high quality factor.

In other words, as the quartz crystal resonator in this embodiment has a high electro-mechanical transformation efficiency, the miniature resonator can be provided with a small series resistance $R_1$ and a high quality factor Q.

Now, when an alternating current (AC) voltage is applied between the electrodes 4 and 5 shown in FIG. 2b, an electric field $E_x$ occurs alternately in the thickness direction, as shown by the arrow direction of the solid and broken lines in FIG. 2b. Consequently, the vibrational portion 3 is capable of extending and contracting in the width direction.

FIG. 3a and FIG. 3b are a top view and a bottom view for a width-extensional mode quartz crystal resonator which constructs a quartz crystal unit and a quartz crystal oscillator of the second embodiment of the present invention. The resonator 12 comprises vibrational portion 13, connecting portions 14, 21, a supporting portion 15 including a mounting portion 16, a supporting frame 17 connected to the mounting portion 16 and supporting frames 18, 19, and a supporting portion 22 including a mounting portion 23 and a mounting portion 20 connected to the mounting portion 23.

In addition, both end portions of the supporting frame 17 are connected to the one end portion of the supporting frames 18, 19 and the other end portion of the frames 18, 19 is connected to the mounting portion 20. The supporting portions 15 and 22 have respective holes 15a and 22a.

Also, electrodes 24 and 26 disposed opposite each other on upper and lower faces of the vibrational portion 13 are of opposite electrical polarities. The electrode 24 extends to the mounting portion 20 through the one connecting portion 21, and the electrode 25 which is of the one electrode terminal is constructed on the mounting portion 20, while the electrode 26 also extends to the mounting portion 20 through the other connecting portion 14 and the supporting frames 17, 19, and the electrode 27 which is of the other electrode terminal is constructed on the mounting portion 20. Namely, two electrode terminals are constructed.

In this embodiment, though only the electrodes of the vibrational portion are disposed opposite thereto, but, it may not be a problem that the opposite electrodes on the other portions such as the supporting frames are disposed because the influence to series resistance $R_1$ thereby is as small as it can be ignored.

In addition, the vibrational portion 13 has a dimension of width $W_0$, length $L_0$ and thickness $T_0$ (not visible in FIGS. 3a, 3b) and also width $W_0$, length $L_0$ and thickness $T_0$ correspond to the respective directions of y', z" and x' axes. Namely, the electrodes 24 and 26 are disposed on the upper and lower faces of the vibrational portion 13 perpendicular to x' axis. Also, the electrodes 24 and 26 have opposite electrical polarities. The vibrational portion 13 has a dimension of length $L_0$ greater than width $W_0$ and thickness $T_0$ smaller than width $W_0$. The concrete relationship of the dimensions is the same as that already described in detail in FIG. 2a and FIG. 2b.

By forming the width-extensional mode quartz crystal resonator like this, the resonator with mechanical strength is provided, so that a manufacturing press excellent in mass production can be taken because it can be mounted at the one end portion thereof on a mounting portion by conductive adhesives or solder. That is, the low priced resonator can be realized, and simultaneously, it can be obtained which is strong against shock.

Moreover, as the supporting portions have the respective holes, a width-extensional mode quartz crystal resonator is capable of vibrating in a width-extensional mode very easily piezoelectrically because the vibration is not suppressed by the supporting portions, as a result, the miniature width-extensional mode quartz crystal resonator can be provided with a small series resistance $R_1$ and a high quality actor Q.

In this embodiment, though the electrodes 25 and 27 with opposite electrical polarities are disposed on the upper and lower faces of the mounting portion 20, embodiment of the present invention also includes the electrode construction for a resonator with opposite electrical polarities on the same plane of the mounting portion 20. For this way, for example, the electrodes disposed opposite each other on the upper and lower faces of the mounting portion 20 are connected so that they have the same electrical polarities through an electrode disposed on a side of the supporting frame or a side of the mounting portion. In addition, the resonator in this embodiment has two supporting frames in parallel to the vibrational portion. The present invention also includes a resonator with one supporting frame because it has sufficiently mechanical strength, and also it has good electrical characteristics.

Figure 4:
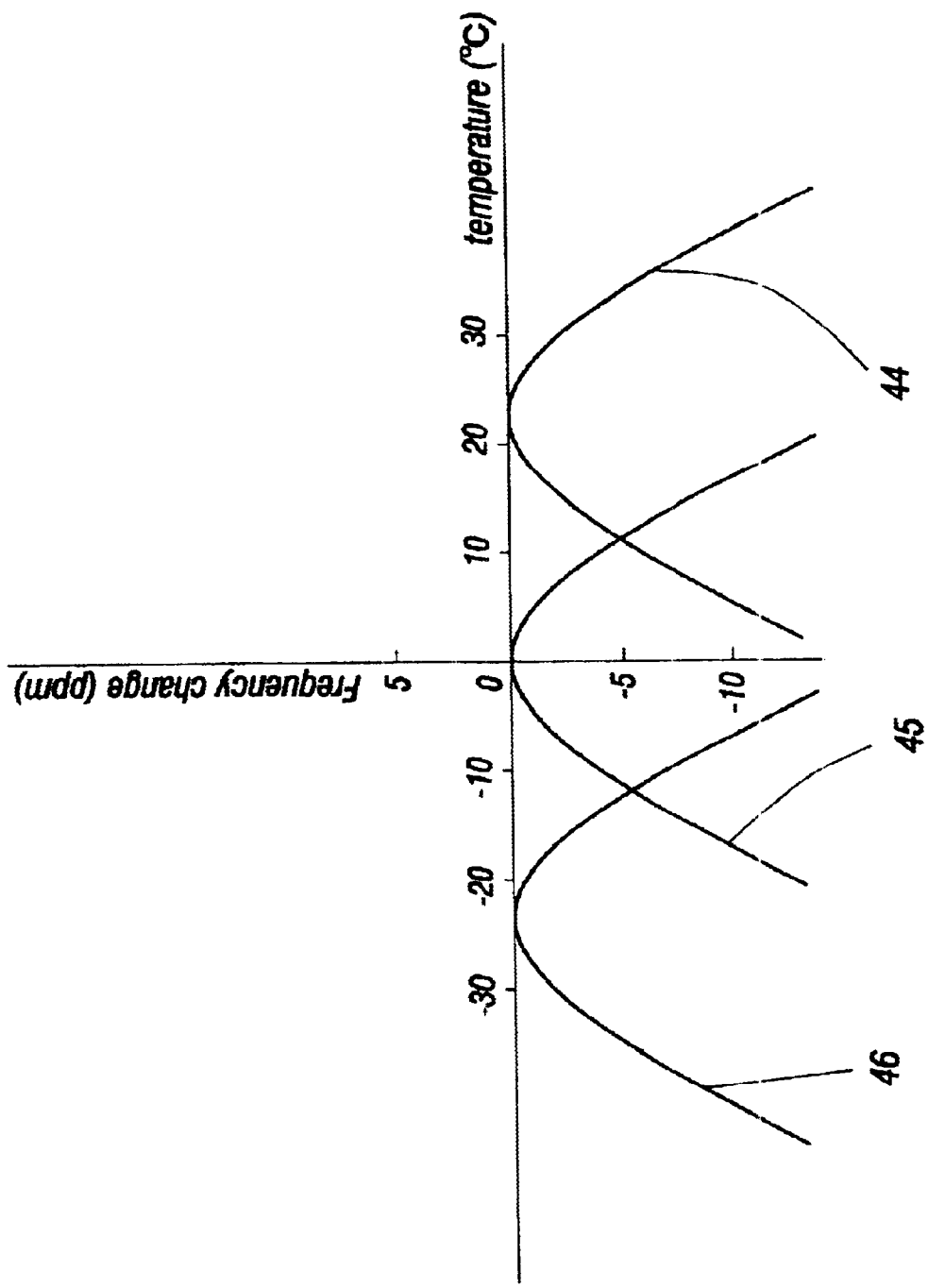
FIG. 4 is an example of frequency temperature behavior for the width-extensional mode quartz crystal resonators of the present invention illustrated in FIGS. 2a, 2b and FIGS. 3a, 3b.

FIG. 4 is an example of frequency temperature behavior for the width-extensional mode quartz crystal resonators of the first and second embodiments of the present invention. There is a zero temperature coefficient for this resonators over a wide temperature range. Namely, the first order temperature coefficient a becomes zero at arbitrary temperature by the selection of the angles $\theta_x$ and $\theta_y$ and the quartz crystal resonators have a parabolic curve.

For example, a turn over temperature point $T_p$ can be set up at about 22° C. which is in the vicinity of room temperature, as shown by the curve 44. The curve 45 has also a turn over temperature point $T_p$ of 0° C., and the curve 46 has $T_p$ of about −23° C. Thus, $T_p$ can be set up from minus temperature to plus temperature, namely, the $T_p$ may be set up over a very wide temperature range of approximately −200° C. to approximately +65° C. for the width-extensional mode quartz crystal resonators having the angles $\theta_x$ and $\theta_y$ in the embodiments. The $T_p$ for the resonator is, therefore, required and determined by such goods as consumer products, communication equipment and so forth.

Thus, as the turn over temperature point $T_p$ for the width-extensional mode quartz crystal resonator of the present invention can be set up arbitrarily over a very wide temperature range and the frequency temperature behavior has the parabolic curve, it is easily understood that the resonator can be provided with a small frequency change over a wide temperature range, namely, with good frequency temperature behavior.

Figure 5A:
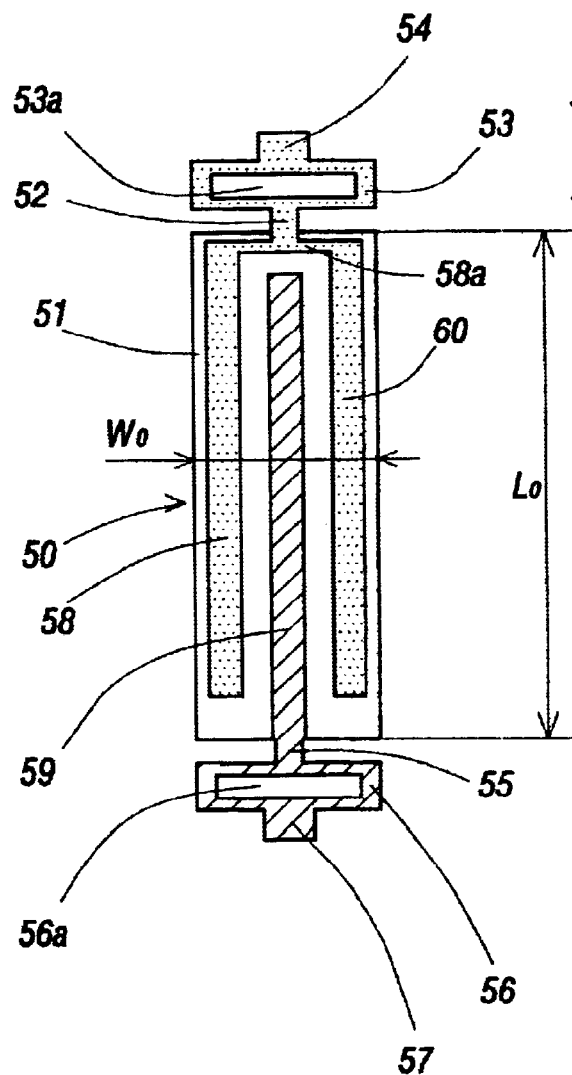
FIG. 5a and FIG. 5b are a top view and a bottom view for a width-extensional mode quartz crystal resonator of the present invention and illustrating electrode arrangement.
Figure 5B:
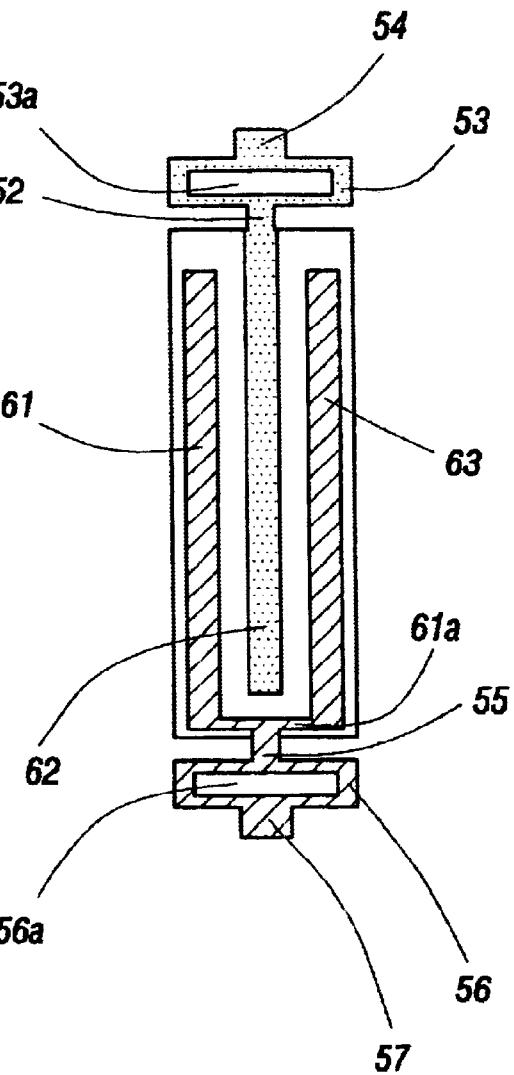

FIG. 5a and FIG. 5b are a top view and a bottom view for a width-extensional mode quartz crystal resonator which constructs a quartz crystal unit and a quartz crystal oscillator of the third embodiment of the present invention. The resonator 50 comprises vibrational portion 51, connecting portions 52, 55 and supporting portions 53, 56 including respective mounting portions 54, 57.

In addition, the supporting portions 53 and 56 have respective holes 53a and 56a, and a plurality of electrodes are disposed on upper and lower faces of the vibrational portion 51, respectively. Also, adjoining electrodes in the width direction of the upper and lower faces have opposite electrical polarities. Moreover, the electrodes disposed opposite to the upper and lower faces have opposite electrical polarities. In this embodiment, the electrodes 58, 59 and 60 are disposed on the upper face and the electrodes 61, 62 and 63 are disposed on the lower face. The width-extensional mode quartz crystal resonator of the third overtone can be provided by the electrode construction in this embodiment.

In more detail, the electrode 58 and the electrode 59 adjoining thereto have opposite electrical polarities. In addition, the electrode 58 and the electrode 63 disposed opposite thereto have also opposite electrical polarities. A pair of electrodes is, therefore, constructed by the electrode 58 and the electrode 63.

Similarly, the electrode 59 and the electrodes 58, 60 adjoining thereto have opposite electrical polarities, the electrode 59 and the electrode 62 disposed opposite thereto have also opposite electrical polarities. A pair of electrodes is, therefore, constructed by the electrodes 59 and 62. Moreover, the electrode 60 and the electrode 59 adjoining thereto have opposite electrical polarities, and the electrode 60 and the electrode 61 disposed opposite thereto have also opposite electrical polarities. A pair of electrodes is, therefore, constructed by the electrodes 60 and 61.

Also, the electrodes 58 and 60 of the upper face are connected through connecting electrode 58a, while the electrodes 61 and 63 of the lower face are connected through connecting electrode 61a. In addition, the electrodes 58 and 60 of the upper face with the same electrical polarity extend to the mounting portion 54 through the one connecting portion 52 and the electrode 59 extends to the mounting portion 57 through the other connecting portion 55.

Similarly, the electrode 62 of the lower face extends to the mounting portion 54 through the one connecting portion 52 and the electrodes 61 and 63 of the lower face with the same electrical polarity extend to the mounting portion 57 through the other connecting portion 55. As is apparent from FIG. 5a and FIG. 5b, the electrodes which are of the same electrical polarities are disposed on the vibrational portion and the supporting portion, in more detail, the electrodes disposed on the vibrational portion extend from the vibrational portion to the upper and lower faces of the one connecting portion and the supporting portion connected to the one connecting portion.

Similarly, the electrodes which are of the same electrical polarities are disposed on the vibrational portion and the supporting portion, in more detail, the electrodes disposed on the vibrational portion extend from the vibrational portion to the upper and lower faces of the other connecting portion and the supporting portion connected to the other connecting portion.

Accordingly, the one electrodes 58, 60 and 62 are of the same electrical polarities, while the other electrodes 59, 61 and 63 which is of the opposite electrical polarities thereto are of the same electrical polarities. Two electrode terminals are, therefore, constructed. In this embodiment, three pairs of electrodes are disposed. The electrode construction of the present invention is not limited to said embodiment. The present invention also includes the electrode construction of n pairs of electrodes (n=5,7,9 . . . ), namely, odd pairs of electrodes for a width-extensional mode quartz crystal resonator which is capable of vibrating in symmetry mode and also, m pairs of electrodes (m=2,4,6 . . . ), namely, even pairs of electrodes for a width-extensional mode quartz crystal resonator which is capable of vibrating in asymmetry mode.

In more detail the width-extensional mode quartz crystal resonator of the present invention has at least one pair of electrodes on the vibrational portion and more, an odd number of electrode pairs for symmetry mode and an even number of electrode pairs for asymmetry mode, respectively.

Next, a relationship of width $W_0$, length $L_0$, thickness $T_0$ of the vibrational portion and the electrode is described in detail. Three pairs of electrodes are disposed in this embodiment. In order to provide the width-extensional mode quartz crystal resonator with good frequency temperature behavior shown in FIG. 4 and a small series resistance $R_1$, a thickness-to-width ratio ($T_0/W_0$) may need a value smaller than 0.283 because the intensity of electric field $E_x$ increases. In addition, to avoid the coupling between width-extensional and length-extensional modes and to provide a width-extensional mode quartz crystal resonator with a small series resistance $R_1$ by increasing electrode area of the vibrational portion, a width-to-length ratio ($W_0/L_0$) may need a value smaller than 0.21.

As described above, though three pairs of electrodes are disposed on the vibrational portion in this embodiment, a $n^{th}$ overtone mode width-extensional mode quartz crystal resonator can be provided by constructing n pairs of electrodes (n=3, 5, 7, . . . ), namely, by disposing an odd number of electrode pairs, a fundamental mode vibration and an overtone mode vibration can be excited. In this case, to provide the quartz crystal resonator with the excellent characteristics, the thickness-to-width ratio ($T_0/W_0$) and the width-to-length ratio ($W_0/L_0$) may need values smaller than 0.85/n and 0.7 n for symmetry mode, respectively. Similarly, the thickness-width ratio and the width-to-length ratio may need values smaller than 0.85/m and 0.7 m for asymmetry mode of the resonator with m pairs of electrodes (m=2, 4, 6, . . . ), namely, an even number of electrode pairs.

Thus, from the embodiments of the present invention, it is easily understood that the miniature width-extensional mode quartz crystal resonator of high-order overtone mode can be realized with a small series resistance $R_1$ and excellent frequency temperature behavior, especially, by devising a means of electrode construction of the vibrational portion. As resonant frequency of the width-extensional mode resonator is proportional to the order of overtone mode, the resonator can be easily provided with a frequency higher than 4 MHz.

Moreover, the electrode construction described in detail in this embodiment is also applied to the resonator of FIG. 3a and FIG. 3b.

As described above, the width-extensional mode quartz crystal resonators in said embodiments have such complicated shapes as comprise the vibrational portion, the connecting portions and the supporting portions. Also, when the resonators in said embodiments of the present invention are processed by a chemical etching method, the etching speed is extremely slow, so that it is very difficult and impossible to process the resonators by the chemical etching method. The resonators in the embodiments of the present invention are, therefore, processed by a physical or mechanical method, and said resonators are formed integrally by the method.

Namely, particles with mass are collided with a quartz crystal plate covered by resist corresponding to the shape of resonators by the physical or mechanical method, as a result of which, the shape of the resonators, is processed because atoms or molecules of the quartz crystal plate scatter. This method is called "particle method" here. This method is, substantially, different from the chemical etching method and simultaneously, it has a feature that the processing speed is also very fast.

According to this particle method, low priced quartz crystal resonators can be provided because the processing time of outward shapes for the resonators shorten extremely. For this particle method, resist with elastic characteristics is used to prevent the resist from defacement by particles, as the resist, for example, plastic resist for use in blast processing is well known. Also, for this particle method, for example, it is preferable to use particles of GC#1000 to GC#6000 as the particles for use in processing.

Furthermore, there are two kinds of resonators for a width-extensional mode: the one is a resonator of the transversal effect type and the other is a resonator of the longitudinal effect type. The resonator of the present invention belongs to the transversal effect type, in more detail the resonator vibrates in the perpendicular diction versus the direction of electric field (thickness direction) and the resonance frequency is not dependent upon a piezoelectric constant at all which is of great importance and necessary to drive it. It is, therefore, very easy to determine accurately resonance frequency of a resonator of the present invention because the frequency is not dependent on the piezoelectric constant.

On the other hand, a resonator of the longitudinal effect type vibrates in the parallel direction versus the direction of electric field (width direction) and the resonant frequency is dependent upon a piezoelectric constant, for example, a KT cut width extensional mode quartz crystal resonator belongs to this. But, the resonators of the present invention are principally different from the KT cut resonator. At the same time, it is needless to say that the quartz crystal resonators of the present invention are formed from the quartz crystal plate with the cut angle different from that of the KT cut quartz crystal resonator.

In addition, the supporting portions of the present invention are connected to the vibrational portion through one connecting portion, respectively, at both end portions of the vibrational portion. Namely, through two connecting portions. However, the present invention is not limited to the shapes of the supporting portions, but includes the shapes of the supporting portions which are connected to the vibrational portion through at least one connecting portion, respectively, at both end portions thereof. In other words, the present invention includes the supporting portions with any shapes which are connected to the vibrational portion through at least one connecting portion, respectively, at both end portions of the vibrational portion.

FIG. 6 is a sectional view of a quartz crystal unit embodying the present invention. The quartz crystal unit 170 comprises a width-extensional mode quartz crystal resonator 70, a case 71 and a lid 72. In more detail, the resonator 70 is mounted on mounting portions 74, 75 constructed at the case 71 by conductive adhesives 76, 77, and the case 71 and the lid 72 are connected through a connecting member 73. In this embodiment, the resonator 70 is the same as one of the resonators 2, 50 described in detail in FIGS. 2a, 2b and FIGS. 5a, 5b.

In addition, though two mounting portions 74, 75 are constructed at the case 71 in this embodiment, either of the two mounting portions may be constructed at the case. For this case it is preferable to house the resonator 12 described in detail in FIG. 3a and FIG. 3b in a case because it is very easy to mount the resonator on a mounting portion at one end portion thereof. In this embodiment, conductive adhesives are used, but solder may be used instead of the adhesives.

Moreover, a member of the case comprises ceramics or glass, a member of the lid comprises metal or glass and a connecting member comprises metal or glass with low melting point. Also, a relationship of the resonator, the case, and the lid described in FIG. 6 is applied to a quartz crystal oscillator which will be described in FIG. 8.

Figure 7:
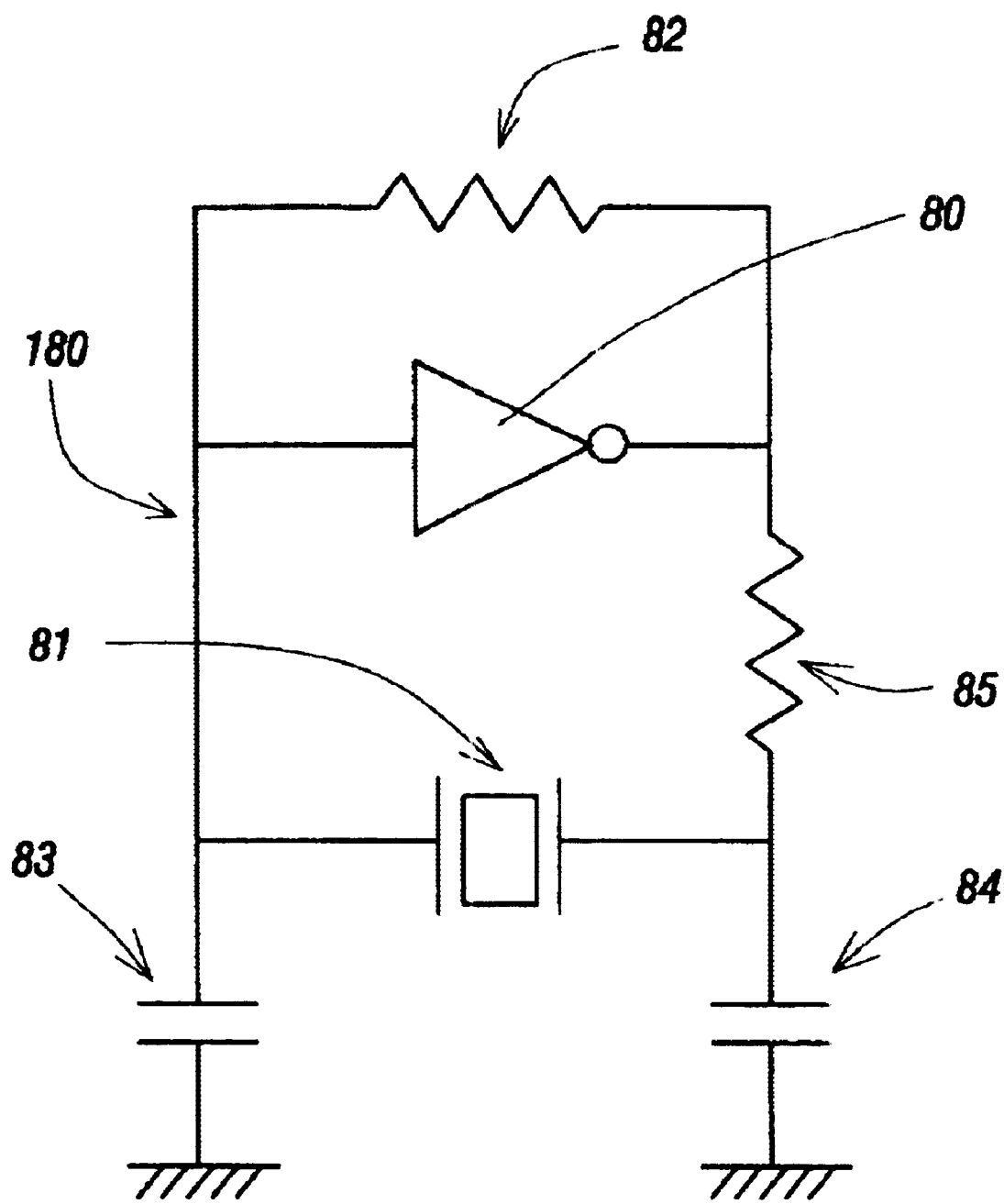
FIG. 7 is a diagram of a quartz crystal oscillator circuit embodying the present invention.

FIG. 7 is a diagram of a quartz crystal oscillator circuit embodying the present invention. The oscillator circuit 180 comprises an amplifier(CMOS inverter) 80, feedback resistance 82, drain resistance 85, capacitors 83, 84 and a width-extensional mode quartz crystal resonator 81. The resonator 81 which is one of the resonators 2, 12 and 50 already described in detail in FIGS. 2a, 2b, FIGS. 3a, 3b and FIGS. 5a, 5b is used according to requirement characteristics of the oscillator circuit Namely, by constructing a quartz crystal oscillator with the width-extensional mode quartz crystal resonator formed from the quartz crystal plate with the new cutting angle, it is possible to provide the oscillator with a frequency higher than 4 MHz, and also possible to provide the oscillator with good frequency temperature behavior because the resonator has a zero temperature coefficient. At the same time, the oscillator can be provided with high frequency stability because the resonator has a high electro-mechanical transformation efficiency by which it has a small series resistance $R_1$ and a high quality factor Q.

In this embodiment, the drain resistance 85 is constructed at the oscillator circuit, but it may not be used when a feedback rate of a feedback circuit comprising the resonator 81, capacitors 83, 84 and the drain resistance 85 is very small. That is, it is possible to control the feedback rate by the drain resistance. Like this, the oscillator circuit of the present invention comprises the width-extensional mode quartz crystal resonator, the CMOS inverter, the capacitors and at least one resistor. In addition, there are two kinds of quartz crystal oscillators; the one is that only the resonator is housed in a quartz crystal unit comprising a case and a lid, and is mounted on a mounting portion of the case, the other is that the oscillator circuit is housed in the quartz crystal unit.

Though an example of the oscillator circuit of the present invention is shown in FIG. 7, the present invention is not limited to this oscillator circuit, but the oscillator circuit of the present invention may comprise a circuit in which a value of load capacitance changes by variable voltage, so called VCXO(Voltage Controlled Crystal Oscillator) and/or a circuit in which frequency temperature behavior is compensated, so called TCXO(Temperature Compensated Crystal Oscillator). Namely, a circuit having VC and TC functions is called a VCTCXO.

Figure 8:
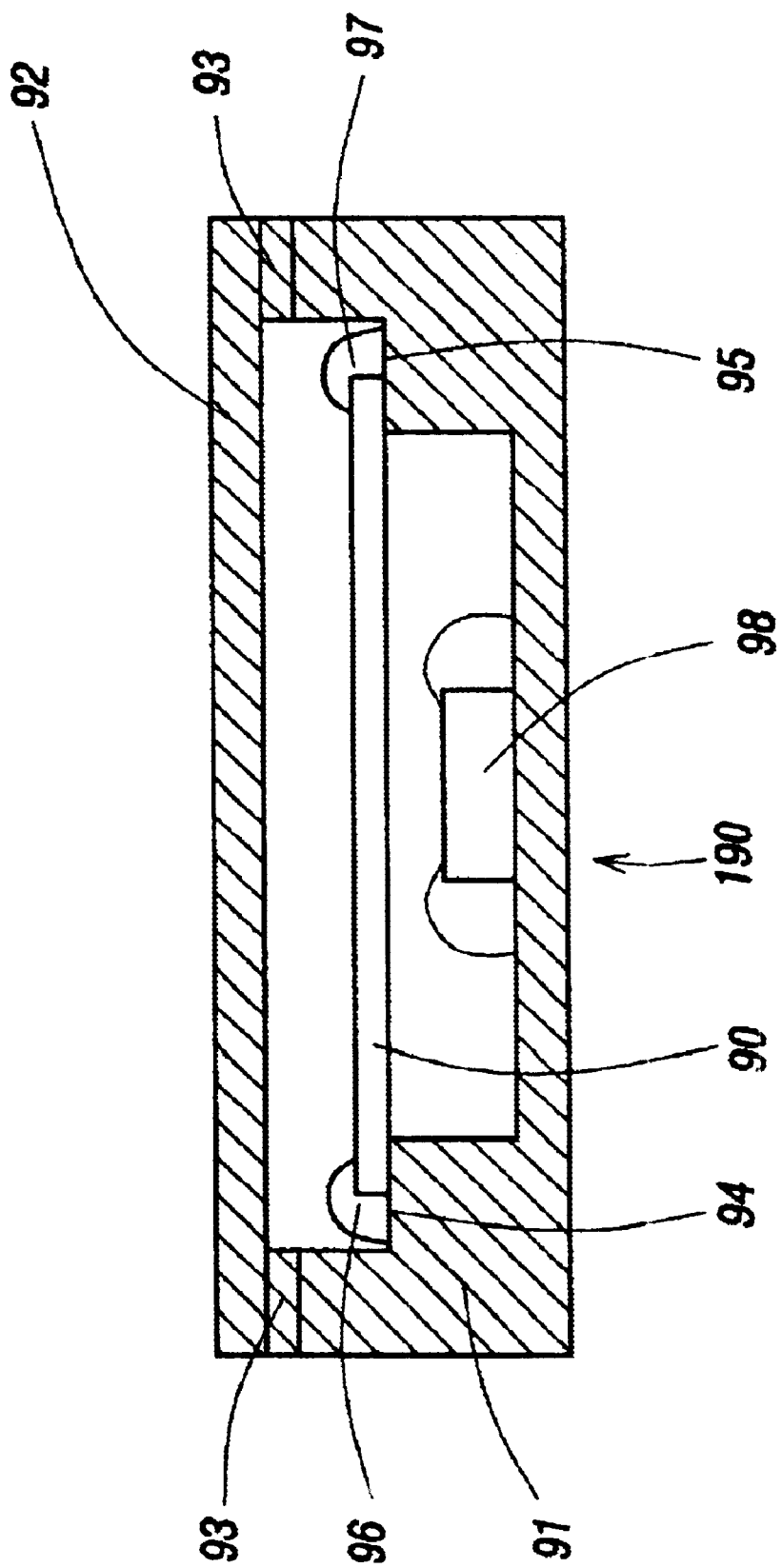
FIG. 8 is a sectional view of a quartz crystal oscillator embodying the present invention.
Figure 9A:
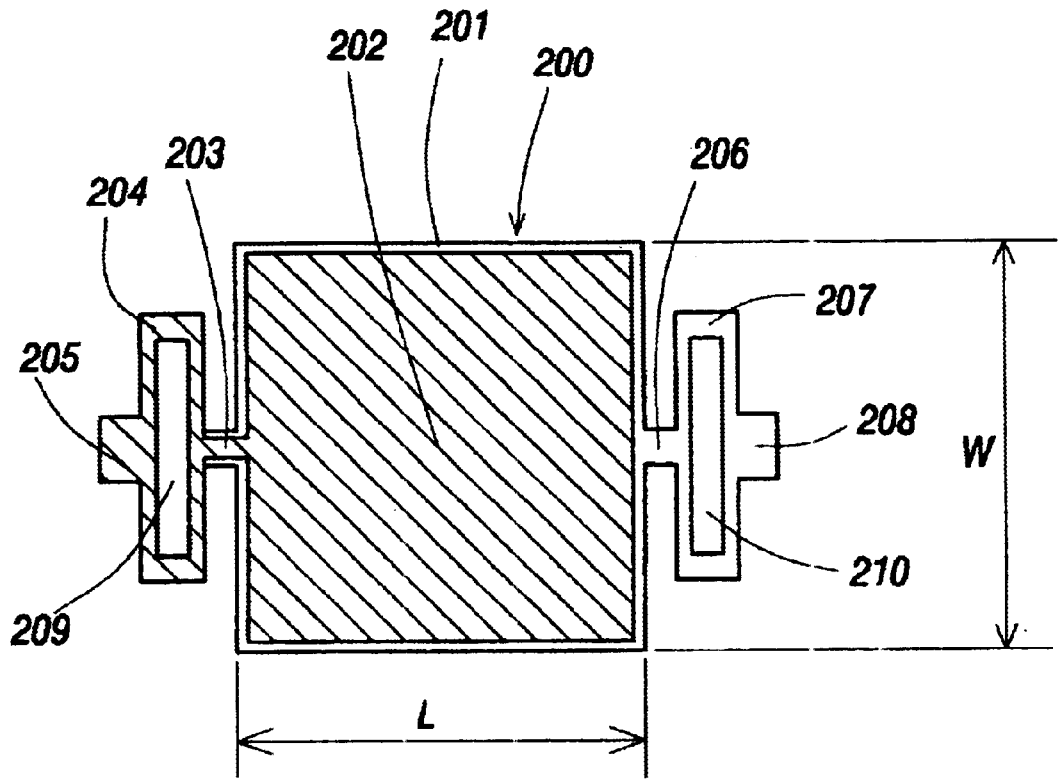
FIG. 9a and FIG. 9b are a top view and a side view of the conventional NS-GT cut coupling quartz crystal resonator.
Figure 9B:
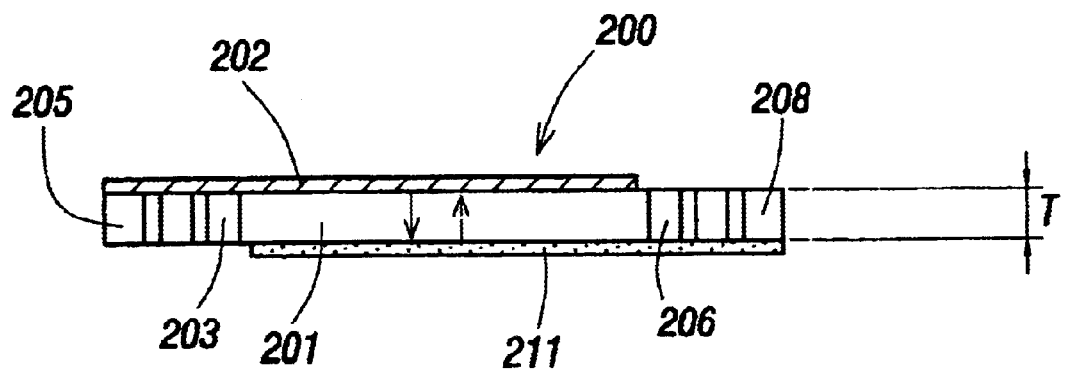
Figure 10:
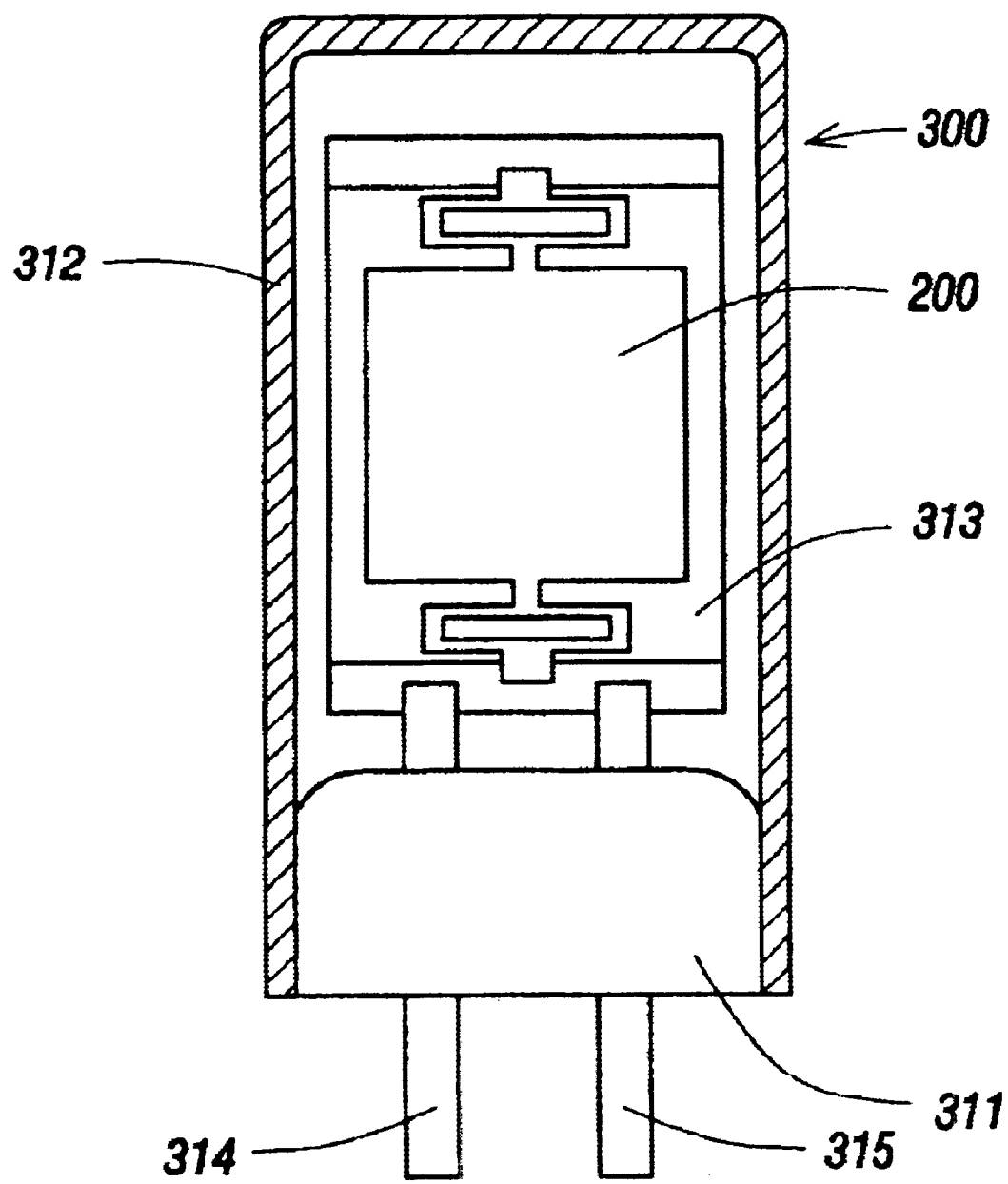
FIG. 10 is a sectional view of the conventional quartz crystal unit of tubular type in which the NS-GT cut coupling quartz crystal resonator is housed.

FIG. 8 is a sectional view of a quartz crystal oscillator embodying the present invention. The quartz crystal oscillator 190 comprises a quartz crystal oscillator circuit provided similar to the quartz crystal oscillator circuit shown in FIG. 7, a case 91, and a lid 92. In this embodiment, the quartz crystal oscillator circuit is housed in a quartz crystal unit comprising the case 91 and the lid 92. The oscillator circuit comprises a width-extensional mode quartz crystal resonator 90, an amplifier(CMOS inverter) 98 including a feedback resistance, capacitors(not visible in FIG. 8) and drain resistance (not visible in FIG. 8).

In this embodiment, the resonator 90 is mounted on mounting portions 94, 95 constructed at the case 91 by conductive adhesives 96, 97, while the amplifier 98 is mounted on the case 91. Also, the case 91 and the lid 92 are connected through a connecting member 93. The resonator 90 in this embodiment is the same as one of the resonators 2, 50 described in detail in FIGS. 2a, 2b and FIGS. 5a, 5b.

As described above, the outstanding effects are provided as follows; by providing the quartz crystal unit and the quartz crystal oscillator comprising the width-extensional mode quartz crystal resonator with the resonator shape, the electrode construction and the cutting angles according to the present invention.

(1) As the piezoelectric constant which is of great importance and necessary to drive the width-extensional mode quartz crystal resonator is extremely large, the electromechanical transformation efficiency becomes large, so that the quartz crystal unit and the quartz crystal oscillator comprising the miniature width-extensional mode quartz crystal resonator with a small series resistance $R_1$ and a high quality factor Q can be obtained.

(2) As at least one pair of electrodes are disposed on the vibrational portion, the quartz crystal unit and the quartz crystal oscillator comprising the width-extensional mode quartz crystal resonator with a frequency higher than 4 MHz and a small series resistance $R_1$ can be realized.

(3) The width-extensional mode quartz crystal resonator can be obtained with a zero temperature coefficient and the turn over temperature point $T_p$ can be changed arbitrarily by selection of the cutting angle.

(4) As the width-extensional mode quartz crystal resonator can be processed by a particle method, it is excellent in mass production, and also the low priced quartz crystal unit and quartz crystal oscillator with the resonator can be provided because a large number of resonators can be formed in one wafer by the particle method at the same time.

(5) As the width-extensional mode quartz crystal resonator comprises the vibrational portion, the connecting portions and the supporting portions, energy losses of the vibrational portion which are caused by mounting it on the mounting portions of the case decrease extremely, as a result of which the quartz crystal unit and the quartz crystal oscillator can be obtained with a small series resistance $R_1$, a high quality factor Q and high frequency stability.

(6) The width-extensional mode quartz crystal resonator can be provided with shock-proof because the vibrational portion, the connecting portions and the supporting portions of the resonator are formed integrally by the particle method and a means of mounting it on the case is very easy.

From the results described above, it will be easily understood that the quartz crystal unit and the quartz crystal oscillator comprising the width-extensional mode quartz crystal resonator with novel shapes, novel electrode construction and novel cutting angles according to the present invention may have the outstanding effects. In addition to this, as the present invention has been shown and described with reference to preferred embodiments thereof, it will be understood by those skilled in the art that the changes in shape and electrode construction can be made therein without departing from the spirit and scope of the present invention.

What is claimed is:

1. A quartz crystal unit comprising a width-extensional mode quartz crystal resonator capable of vibrating in a width-extensional mode, a case and a lid, wherein said resonator comprises:

a vibrational portion having a length greater than a width and a thickness smaller than the width;

connecting portions located at ends of said vibrational portion;

supporting portions connected to said vibrational portion through said connecting portions; and electrodes disposed opposite each other on upper and lower faces of said vibrational portion, and wherein a cutting angle of said resonator is expressed by either of XZtw($\theta_x$)/($\theta_y$) and XZwt($\theta_y$)($\theta_x$) and the $\theta_x$ and $\theta_y$ are within a range of $-25°$ to $+25°$ and $-30°$ to $+30°$, respectively.

2. The quartz crystal unit according to claim 1, wherein said resonator is capable of vibrating in a perpendicular direction versus an electric field direction corresponding to a thickness direction thereof.

3. The quartz crystal unit according to claim 2, wherein said resonator is a transversal effect type resonator.

4. The quart crystal unit according to claim 3, wherein at least one pair of electrodes is disposed on the upper and lower faces of the vibrational portion perpendicular to the thickness direction.

5. The quartz crystal unit according to claim 4, wherein a piezoelectric constant $e_{12}$ of said resonator is within a range of 0.095 C/m$^2$ to 0.18 C/m$^2$ in the absolute value.

6. The quartz crystal unit according to claim 4, wherein said resonator has an odd number of electrode pairs for symmetry mode and an even number of electrode pairs for asymmetry mode.

7. The quartz crystal unit according to claim 4, wherein a thickness-to-width ratio ($T_0/W_0$) and a width-to-length ratio ($W_0/L_0$) is smaller than 0.85/n and 0.7/n for symmetry mode, and 0.85/m and 0.7/m for asymmetry mode, respectively.

8. The quartz crystal unit according to claim 4, wherein a width-to-length ratio ($W_0/L_0$) is less than 0.7 and a thickness-to-width ratio ($T_0/W_0$) is less than 0.85 for a fundamental vibration mode.

9. The quartz crystal unit according to claim 4, wherein said resonator is mounted on a mounting portion of a case by conductive adhesives or solder.

10. The quartz crystal unit according to claim 9, wherein said case and said lid are closed through a closing member and said resonator is in vacuum.

11. A method of manufacturing a quartz crystal unit comprising a width-extensional mode quartz crystal resonator capable of vibrating in a width-extensional mode, a case and a lid, wherein said quartz crystal unit comprises the step of:

utilizing a particle method form said resonator comprising;

a vibrational portion having a length greater than a width and a thickness smaller than the width, connecting portions located at ends of said vibrational portion, and supporting portions connected to said vibrational portion through said connecting portions, and wherein a cutting angle of said resonator is expressed by either of XZtw($\theta_x$)/($\theta_y$) and XZwt($\theta_y$)/($\theta_x$) and the $\theta_x$ and $\theta_y$ are within a range of −25° to +25° and −30° to +30°, respectively.

12. The method of claim 11, wherein said resonator has an odd number of electrode pairs for symmetry mode and an even number of electrode pairs for asymmetry mode.

13. The method of claim 11, wherein a thickness-to-width ratio ($T_0/W_0$) and a width-to-length ratio ($W_0/L_0$) is smaller than 0.85 and 0.7, respectively.

14. The method of claim 13, comprising the further step of connecting said case and said lid through a connecting member.

15. A quartz crystal oscillator comprising a width-extensional mode quartz crystal resonator capable of vibrating in a width-extensional mode, an amplifier, capacitors and at least one resistor, wherein said quartz crystal resonator comprises:

a vibrational portion having a length greater than a width and a thickness smaller than the width;

connecting portions located at ends of said vibrational portion;

supporting portions connected to said vibrational portion through said connecting portions; and electrodes disposed on upper and lower faces of said vibrational portion, and wherein a piezoelectric constant $e_{12}$ of said resonator is within a range of 0.095 C/m$^2$ to 0.18 C/m$^2$ in the absolute value.

16. The quartz crystal oscillator according to claim 15, wherein a cutting angle of said resonator is within a range of XZtw(−25°−+25°)/(−30°−+30°).

17. The quartz crystal according to claim 15, wherein a cutting angle of said resonator is within a range of XZwt(−30°−+30°)/(−25°−+25°).

18. The quartz crystal oscillator according to claim 15, wherein said amplifier is a CMOS inverter.

19. The quartz crystal oscillator according to claim 18, wherein said resonator, said CMOS inverter, said capacitors and said at least one resistor are housed in a quartz crystal unit.

20. The quartz crystal oscillator according to claim 18, wherein said oscillator is one of a VCXO, a TCXO and a VCTCXO.

* * * * *